(12) United States Patent
Ozawa et al.

(10) Patent No.: US 7,300,972 B2
(45) Date of Patent: *Nov. 27, 2007

(54) WATER-SOLUBLE POLYIMIDE PRECURSOR, AQUEOUS POLYIMIDE PRECURSOR SOLUTION, POLYIMIDE, IMPREGNATED MATERIAL WITH POLYIMIDE BINDER, AND LAMINATE

(75) Inventors: Hideki Ozawa, Ichihara (JP); Fumio Aoki, Ichihara (JP)

(73) Assignee: Ube Industries Ltd., Yamaguchi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/253,599

(22) Filed: Oct. 20, 2005

(65) Prior Publication Data

US 2006/0057916 A1     Mar. 16, 2006

Related U.S. Application Data

(62) Division of application No. 10/059,347, filed on Jan. 31, 2002, now abandoned.

(30) Foreign Application Priority Data

Feb. 5, 2001   (JP) ............................... 2001-27780
Dec. 18, 2001  (JP) .............................. 2001-385181

(51) Int. Cl.
     *C08L 79/08*     (2006.01)
(52) U.S. Cl. ...................... 524/538; 528/310; 528/322; 528/350; 528/351
(58) Field of Classification Search ................ 528/170, 528/353, 310, 322, 350, 351; 428/411.1, 428/473.5; 524/538
     See application file for complete search history.

(56) References Cited

U.S. PATENT DOCUMENTS

| | | | | |
|---|---|---|---|---|
| 4,019,877 | A  * | 4/1977 | Gass et al. ................... | 428/626 |
| 5,260,412 | A   | 11/1993 | Yamamoto et al. ......... | 528/353 |
| 5,741,598 | A   | 4/1998 | Shiotani et al. ............. | 428/458 |
| 6,379,784 | B1 * | 4/2002 | Yamamoto et al. ......... | 428/216 |
| 6,534,622 | B2 * | 3/2003 | Yamaguchi et al. ........ | 528/170 |
| 6,538,097 | B2 * | 3/2003 | Yamaguchi et al. ........ | 528/170 |
| 6,808,818 | B2 * | 10/2004 | Ozawa et al. ............. | 428/473.5 |
| 7,019,103 | B2 * | 3/2006 | Yokota et al. ............... | 528/170 |
| 2002/0106521 | A1 | 8/2002 | Hashimoto et al. ......... | 428/447 |

FOREIGN PATENT DOCUMENTS

| | | |
|---|---|---|
| JP | 3-15659 | 3/1991 |
| JP | 8-3445 | 1/1996 |
| JP | 8-59832 | 3/1996 |
| JP | 8-291252 | 11/1996 |
| JP | 10-131017 | 5/1998 |

* cited by examiner

*Primary Examiner*—Ana Woodward
(74) *Attorney, Agent, or Firm*—Morgan, Lewis & Bockius LLP

(57) ABSTRACT

A water-soluble polyimide precursor, which can be suitably applied for aromatic polyimides and exhibits a low reduction in heat resistance and mechanical properties, an aqueous solution of the polyimide precursor and a polyimide obtained from the precursor. A heat-resistant fiber impregnated material and an impregnated sheet-like material are prepared by using the precursor and a laminate is prepared by employing the precursor.

12 Claims, No Drawings

WATER-SOLUBLE POLYIMIDE PRECURSOR, AQUEOUS POLYIMIDE PRECURSOR SOLUTION, POLYIMIDE, IMPREGNATED MATERIAL WITH POLYIMIDE BINDER, AND LAMINATE

This is a divisional application of U.S. application Ser. No. 10/059,347 (filed Jan. 31, 2002) now abandoned which claims the benefit of Japanese Patent Application No. 2001-27780 (filed Feb. 5, 2000 and Japanese Patent Application No. 2001-385181 (filed Dec. 18, 2000), all of which are herein incorporated by reference in their entirety.

BACKGROUND OF THE INVENTION

1. Field of the Invention

The present invention relates to a water-soluble polyimide precursor, an aqueous polyimide precursor solution and a polyimide and, particularly, it relates to a water-soluble polyimide precursor, an aqueous polyimide precursor solution and a polyimide which give polyimide molded articles that maintain a high level of heat resistance while exhibiting high tensile strength and high elongation.

The invention further relates to an impregnated material with a polyimide binder and to a laminate, and particularly it relates to an impregnated material with a polyimide as the binder which can be produced substantially without using any organic solvent in the heating step and which ensures heat resistance and strength for molded articles, and to a laminate suitable for use as a circuit board.

2. Description of the Related Art

Polyimides obtained by reaction between aromatic tetracarboxylic dianhydrides and aromatic diamines generally exhibit excellent heat resistance, mechanical strength, electrical properties and solvent resistance, and are therefore widely used in the electrical and electronic industrial fields. However, most fully aromatic polyimides have poor solubility in organic solvents and, consequently, an organic solvent solution of the precursor polyamic acid is usually applied and subjected to dehydrating ring closure, by high temperature heating, for preparation of a polyimide molded article. For this reason they have not always been advantageous from the standpoint of working environment, and their uses have therefore been limited.

As polyimide molded articles using no organic solvents there are widely employed molded articles molded from pyromellitic acid-based polyimide powders obtained from pyromellitic acid components and 4,4'-diaminodiphenylether.

Polyimide powders, however, have no appropriate solvents in which they can dissolve, and therefore their uses have been limited due to considerations of molded article production and workability.

Water-soluble polyimide precursor powders and aqueous polyimide precursor solutions have therefore been proposed.

In connection with such water-soluble polyimide precursor powders and aqueous polyimide precursor solutions, Japanese Examined Patent Publication No. 3-15659, for example, describes an example of obtaining a water-soluble polyimide by synthesizing a 2,3,5-tricarboxy-cyclopentylacetic acid-based polyimide precursor in an amide-based solvent and reacting it with triethylamine, diethylamine or the like.

Also, Japanese Unexamined Patent Publications No. 8-3445, No. 8-59832 and No. 8-291252 describe examples of obtaining water-soluble polyimide precursors by reacting aminoalcohol-based amine compounds with polyimide precursors.

However, the aforementioned water-soluble polyimide precursor described in Japanese Examined Patent Publication No. 3-15659 has a special chemical structure which limits its performance and application.

In addition, the water-soluble polyimide precursors described in the aforementioned Japanese Unexamined Patent Publications No. 8-3445, No. 8-59832 and No. 8-291252 have limited applications because the polyimide films prepared as molded articles therefrom have low heat resistance (especially thermal decomposition temperature) and mechanical properties (especially elongation) compared to polyimide films obtained from polyimide precursors employing ordinary polar organic solvents.

Nonwoven fabrics comprising aramid fibers fixed with binders made of phenol resins, epoxy resins or thermoplastic polyesters have been developed as heat-resistant nonwoven fabrics and, for example, Japanese Unexamined Patent Publication No. 10-131017 describes fabrication of a circuit board with aramid fibers and an epoxy resin; however, because of the inadequate heat resistance of the binder, the board has not been suitable for prolonged use under high temperature conditions. Heat-resistant nonwoven fabrics using water-soluble polyimide varnishes and the like as binders have also been developed, but these have also been impractical because of vastly reduced strength under environments at 200° C. or above. Although the heat resistance of the fibers composing these heat-resistant nonwoven fabrics is adequate, the unsatisfactory heat resistance of the binders has been a major problem.

BRIEF SUMMARY OF THE INVENTION

It is therefore an object of the present invention to provide a water-soluble polyimide precursor which can be suitably applied for aromatic polyimides and which exhibits low reduction in heat resistance (especially thermal decomposition temperature) and mechanical properties (especially elongation), as well as an aqueous polyimide precursor solution and polyimide.

It is another object of the invention to provide an impregnated material with a novel polyimide as the binder which has no significant reduction in tensile strength even in environments of 200° C. or above, exhibits high shape retention and which can be used in the form of an aqueous solution for mixture of heat resistant fibers and a binder resin, as well as an impregnated sheet-like material corresponding to the prepreg for a thermosetting resin employing the aforementioned impregnated material, and a laminate employing the impregnated sheet-like material.

In other words, the present invention provides a water-soluble polyimide precursor which gives a polyimide having a thermal decomposition temperature of 500° C. or above and a breaking elongation of 15% or greater, preferably 20% or greater, especially 30-150%, and preferably having a glass transition temperature of 190-350° C., especially 200-350° C., when shaped into a film.

The invention further provides a powdered water-soluble polyimide precursor obtained by separation from a mixture resulting from a reaction between a polyimide precursor comprising a tetracarboxylic acid component and an aromatic diamine component with 1,2-dimethylimidazole and/or 1-methyl-2-ethylimidazole at 0.7 molar equivalents or more with respect to the carboxyl groups of the aforementioned polyimide precursor.

The invention still further provides a polyimide precursor solution prepared by dissolving the aforementioned water-soluble polyimide precursor in water.

The invention still further provides a polyimide obtained by imidation of the aforementioned water-soluble polyimide precursor.

The invention still further provides a polyimide, obtained by heat imidation of a water-soluble polyimide precursor, which exhibits a heat resistance equivalent to that of a polyimide obtained by heat imidation of a non-water-soluble polyimide precursor obtained by reaction of the same tetracarboxylic acid and aromatic diamine components that give the water-soluble polyimide precursor, at the same composition.

The invention still further provides a heat-resistant fiber impregnated material which retains at least 70% of its tensile strength even when left in an environment at 200° C. for one hour, which is obtained by using a polyimide obtained from a water-soluble polyimide precursor as the binder resin for heat-resistant fibers.

The invention still further provides a heat-resistant fiber impregnated material, wherein a polyimide obtained from a water-soluble polyimide precursor containing 1,2-dimethylimidazole and/or 1-methyl-2-ethylimidazole is used as the binder resin for heat-resistant fibers.

The invention still further provides a glass impregnated material wherein a polyimide obtained from a water-soluble polyimide precursor containing 1,2-dimethylimidazole and/or 1-methyl-2-ethylimidazole is used as the binder resin for heat-resistant fibers.

The invention still further provides an impregnated sheet-like material prepared by further impregnating the aforementioned impregnated material with a heat-bonding polyimide.

The invention still further provides a laminate prepared by bonding a conductive metal layer onto the aforementioned impregnated sheet-like material.

DETAILED DESCRIPTION OF THE INVENTION

Preferred embodiments of the invention will now be listed.

1) The aforementioned water-soluble polyimide precursor wherein the polyimide is amorphous based on X-ray analysis.

2) The aforementioned water-soluble polyimide precursor wherein the tetracarboxylic acid component contains at least 50% of a 2,3,3',4'-biphenyltetracarboxylic acid component.

3) The aforementioned polyimide wherein the polyimide has a heat-bonding property.

4) The aforementioned heat-resistant fiber impregnated material wherein the polyimide is amorphous based on X-ray analysis.

5) The aforementioned heat-resistant fiber impregnated material wherein the polyimide is obtained with at least 50% of a 2,3,3',4'-biphenyltetracarboxylic acid component as the tetracarboxylic acid component.

6) The aforementioned impregnated sheet-like material wherein the heat-bonding polyimide is a polyimide with an imide unit represented by the following formula:

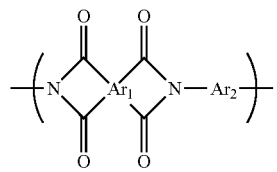

wherein $Ar_1$ is an aromatic tetracarboxylic dianhydride residue, comprising 3,3',4,4'-biphenyltetracarboxylic dianhydride residue and 2,3,3',4'-biphenyltetracarboxylic dianhydride residue in a molar ratio of 0:100-90:10, and $Ar_2$ is an aromatic diamine residue, comprising 1,3-bis(4-aminophenoxy)benzene or 1,3-bis(3-aminophenoxy)benzene and p-phenylenediamine and/or diaminodiphenylether in a molar ratio of 10:90-100:0.

7) The aforementioned laminate wherein the metal layer is a copper foil.

According to the invention, a polyimide obtained from a water-soluble polyimide precursor containing 1,2-dimethylimidazole and/or 1-methyl-2-ethylimidazole is preferably employed. More preferably the 1,2-dimethylimidazole and/or 1-methyl-2-ethylimidazole is added at 0.2 molar equivalents or more with respect to the carboxyl groups of the polyimide precursor.

By using the 1,2-dimethylimidazole and/or 1-methyl-2-ethylimidazole together with the polyimide precursor, an aqueous solution of the polyimide precursor can advantageously be obtained, and the resulting polyimide molded articles have satisfactory thermal properties and mechanical properties.

It is not preferred to use another diamine compound such as diethanolamine, triethanolamine, N-methyldiethanolamine or 3-diethylamino-1-propanol instead of the 1,2-dimethylimidazole and/or 1-methyl-2-ethylimidazole because, although the polyimide precursor will still form an aqueous solution, the resulting polyimide molded articles will exhibit reduced thermal and mechanical properties.

The polyimide yielding the water-soluble polyimide precursor may be obtained using as the tetracarboxylic acid component 3,3',4,4'-biphenyltetracarboxylic dianhydride, 2,3,3',4'-biphenyltetracarboxylic dianhydride, pyromellitic dianhydride, 3,3',4,4'-benzophenonetetracarboxylic dianhydride, dianhydride of 2,2'-bis(3,4-dicarboxyphenyl)propane, dianhydride of bis(3,4-dicarboxyphenyl)methane, dianhydride of bis(3,4-dicarboxyphenyl)ether or their tetracarboxylic acids or half esters. All or a portion of the aromatic tetracarboxylic acid component may also be replaced with an alicyclic tetracarboxylic acid component. Most preferably, at least 50% of the tetracarboxylic acid component is a 2,3,3',4'-biphenyltetracarboxylic acid component.

The polyimide yielding the water-soluble polyimide precursor may be obtained using as the aromatic diamine component any desired aromatic diamine, for example, paraphenylenediamine(p-phenylenediamine), 4,4'-diaminodiphenylether, 1,3-bis(4-aminophenoxy)benzene, 1,3-bis(3-aminophenoxy)benzene, 4,4'-diaminodiphenylpropane, 4,4'-diaminodiphenylethane, 4,4'-diaminodiphenylmethane, 2,2'-bis[4-(4-aminophenoxy)phenyl]propane, 2,2'-bis[4-(4-aminophenoxy)phenyl]1,1,1,3,3,3-hexafluoropropane, bis[4-(4-aminophenoxy)phenyl]ether or bis[4-(3-aminophenoxy)phenyl]sulfone, but it is preferably obtained using 1,3-bis(4-aminophenoxy)benzene or 1,3-bis(3-aminophenoxy)benzene. A portion of the aromatic diamine may also be replaced with an alicyclic diamine or diaminopolysiloxane.

According to the invention, the polyimide is preferably amorphous, based on X-ray analysis.

The polyimide obtained according to the invention achieves satisfactory molding workability and high productivity using an aqueous polyimide precursor solution, with virtually no reduction in heat resistance and mechanical properties compared to polyimides obtained from polyimide precursor solutions obtained using ordinary organic polar solvents (organic solvent solution-type polyimides) and their polyimide films (i.e. a thermal decomposition temperature of no more than 5° C. below, and approximately equal to or greater than, the thermal decomposition temperature of an organic solvent solution-based polyimide, a tensile breaking strength of at least 85% of the value of an organic solvent solution-based polyimide, and an elongation of at least about 50% of the value of an organic solvent solution-based polyimide).

When shaped into a film, the polyimide of the invention preferably has a thermal decomposition temperature of 500° C. or above. The polyimide has, preferably, a glass transition temperature of 190-350° C., particularly 200-350° C. and especially 250-275° C. and a breaking elongation of 15% or greater, particularly 20% or greater and especially 30-150%.

According to the invention, the binder which is thermocompression bonded onto the heat-resistant fibers must be composed mainly of a polyimide resin obtained by imidation of the aforementioned polyimide precursor, but the resin or resin precursor may also be blended with other heat-resistant resins (or resin precursors) so long as they are water-soluble.

According to the invention, the aqueous polyimide precursor solution is preferably obtained by reacting a polyimide precursor, obtained adding each of the components to a polyimide precursor concentration of about 0.1-30 wt %, preferably in a water-soluble ketone and/or amide-based solvent, and reacting the tetracarboxylic dianhydride and aromatic diamine at 0-40° C. for about 30 minutes to 24 hours, with 1,2-dimethylimidazole and/or 1-methyl-2-ethylimidazole at 0.7 molar equivalents or more with respect to the carboxyl groups of the polyimide precursor and then filtering out the precipitate from the reaction mixture or causing it to precipitate with an organic poor solvent such as acetone and then filtering out the precipitate, to prepare a polyimide precursor powder, drying it at a temperature of 100° C. or below, adding this powder into water together with 1,2-dimethylimidazole and/or 1-methyl-2-ethylimidazole at 0.2 molar equivalents or more, especially 0.7 molar equivalents or more (total), and most preferably 0.9 molar equivalents or more (total) with respect to the carboxyl groups of the polyimide precursor, and preparing a uniform mixture. The 1,2-dimethylimidazole and/or 1-methyl-2-ethylimidazole may also be preadded to the water.

The aqueous polyimide precursor solution preferably has a viscosity (at 30° C.) of about 0.2-800 poise.

As amide-based solvents there may be mentioned N-methyl-2-pyrrolidone (NMP), N,N-dimethylacetamide (DMAc), N,N-dimethylformamide and N-methylcaprolactam, among which N-methyl-2-pyrrolidone and N,N-dimethylacetamide are particularly preferred for use.

As water-soluble ketones there may be mentioned acetone, γ-butyrolactone, methyl ethyl ketone, methyl isobutyl ketone, methyl n-butyl ketone and cyclohexanone.

According to the invention, during or preferably after the reaction between the tetracarboxylic dianhydride and the aromatic diamine, preferably, the polyimide precursor (polyamic acid) and 1,2-dimethylimidazole and/or 1-methyl-2-ethylimidazole are reacted together, the polyimide precursor powder is separated from the reaction mixture and the obtained powder is mixed with water to obtain the polyimide precursor aqueous solution.

The amount of the 1,2-dimethylimidazole and/or 1-methyl-2-ethylimidazole is preferably at least 0.2 molar equivalents with respect to the carboxyl groups of the polyimide precursor, when the polyimide precursor is separated from the reaction mixture as a powder. With a lower amount, the polyimide precursor becomes tar-like, making it difficult to separate the polyimide precursor from the reaction mixture as a powder.

When the polyimide precursor is prepared as an aqueous solution, the amount is preferably at least 0.7 molar equivalents with respect to the carboxyl groups of the polyimide precursor with a lower amount, it becomes difficult to obtain a uniform aqueous solution of the polyimide precursor.

According to the invention, the method of making the aqueous polyimide precursor solution into a binder resin for glass fibers may be a method in which, for example, the aqueous polyimide precursor solution is included in the glass fibers and heated for imidation.

As heat-resistant fibers according to the invention there may be mentioned nonwoven fabrics, chopped fibers, staple fibers, pulpy glass fibers and the like.

There may also be mentioned fully aromatic polyamide fibers, carbon fibers, fully aromatic polyester fibers, PPS fibers, polyparaphenylene sulfone fibers, polyimide fibers and the like, with fully aromatic polyamide fibers, fully aromatic polyester fibers and polyimide fibers being preferred.

These heat-resistant fibers may also be used together with inorganic particulate fillers such as artificial diamond, silica, mica, kaolin, boron nitride, aluminum oxide, iron oxide, graphite, molybdenum sulfide, iron sulfide or the like, or with organic or inorganic pigments, coloring agents or the like. There are no particular restrictions on the method of addition, and for example, they may be added to the polyimide precursor aqueous solution.

In the invention, the heat-resistant fibers, preferably in the form of a web, may be combined with the aqueous polyimide precursor solution and preferably a laminate thereof, and heated for 5-120 minutes at a temperature of about 100-450° C., preferably at a temperature above the glass transition temperature of the polyimide, and especially at a temperature between 20° C. above than the glass transition temperature of the polyimide and no higher than 450° C., to form impregnated heat-resistant fibers (a heat-resistant nonwoven fabric).

For the method of manufacturing the impregnated heat-resistant fibers, first the short fibers (nonwoven fabric, chopped fibers, dry pulp or the like) are dispersed in a large amount of water, and a wet web is continuously obtained by a sheeting method in which sheeting is performed on a net to prepare a wet web, or by a carding method in which heat-resistant staple fibers are passed through a roller card to prepare a web.

Next, the wet web is sandwiched between thick synthetic resin fabrics such as Tetran fabrics, and then sandwiched on both sides with moisture-absorbing materials (for example, filter paper) to remove the excess moisture, followed by heating at about 120° C. in a heating furnace to remove the moisture and obtain a dry web. Also, the web alone is sandwiched between wire nettings (for example, SUS wire nettings of about 50 mesh), immersed for a prescribed period (about 0.1-5 minutes) in the above-mentioned aqueous polyimide precursor solution as the dope solution, and then sandwiched between moisture-absorbing materials (for example, filter paper) to remove the excess dope solution and obtain a dope-impregnated web.

After then drying the dope-impregnated web for about 10-30 minutes in a heating furnace adjusted to about 100° C., it is heated at a temperature above the glass transition temperature of the thermoplastic polyimide resin, preferably 210-400° C. and especially about 250-400° C. for about 3-60 minutes, for imidation, to obtain a heat-resistant fiber impregnated material.

Here, the amount of the thermoplastic polyimide resin binder may be determined by the difference between the weight of the dry web and the weight of the heat-resistant fiber impregnated material (nonwoven fabric) after imidation.

The press temperature may be preset to about 250-400° C., and the heat-resistant fiber impregnated material sandwiched between heat-resistant films (for example, polyimide films) and subjected to thermocompression bonding for about 0.1-10 minutes at a pressing pressure of about 1-100 MPa.

Because the heat-resistant fiber impregnated material (nonwoven fabric) obtained according to the invention employs a binder resin, the problem of fluff loss does not occur and, as it is obtained by hot molding of the thermoplastic polyimide used as the binder resin, it exhibits satisfactory thermal and mechanical properties, and particularly a heat-resistant nonwoven fabric will exhibit a tensile strength retention of 70% or greater at 200° C.

The impregnated sheet-like material (also referred to as a prepreg) of the invention may be obtained, for example, by impregnating the aforementioned fiber impregnated material with an organic solvent solution or aqueous suspension of a heat-bonding polyimide, and heating at preferably 210-400° C. and particularly about 250-400° C. for about 3-60 minutes for heat treatment.

The above-mentioned heat-bonding polyimide is not particularly restricted so long as it is a polyimide exhibiting a heat-bonding property at about 210-300° C. and especially about 210-275° C., but polyimides represented by the chemical formula shown above may be mentioned as preferred ones. A heat-bonding polyimide represented by the above chemical formula may be obtained, for example, by polymerizing an aromatic tetracarboxylic dianhydride comprising 3,3',4,4'-biphenyltetracarboxylic dianhydride and 2,3,3',4'-biphenyltetracarboxylic dianhydride in a molar ratio of 0:100-90:10, with an aromatic diamine comprising 1,3-bis(4-aminophenoxy)benzene or 1,3-bis(3-aminophenoxy)benzene and p-phenylenediamine and/or diaminodiphenylether in a molar ratio of 10:90-100:0, in an organic solvent, and preferably in an organic solvent with a relatively high boiling point such as NMP or DMAc, and then heating at a temperature in the range of 120-200° C. for imidation. A portion, but preferably not more than 50 mole percent, of the aforementioned aromatic tetracarboxylic dianhydride may be replaced with pyromellitic dianhydride.

The laminate of the invention may be obtained by contact bonding the aforementioned impregnated sheet with a conductive metal layer, preferably a metal foil or metal plate of copper, aluminum, iron, gold or the like or an alloy foil or alloy plate of these metals, and particularly a calendered copper foil, electrolytic copper foil or SUS foil, at 250-400° C. under a pressure of 1-100 MPa for 0.1-10 minutes.

When copper foil is used as the metal layer, the thickness is preferably about 3-18 μm and, when SUS foil is used, the thickness is preferably about 10-35 μm.

The copper foil preferably has neither very high nor very low surface roughness, and the Rz of the contact surface with the polyimide thin-layer is preferably no greater than 3 μm, especially 0.5-3 μm, and most preferably 1.5-3 μm. Such metal foils, such as copper foils, are known as VLP, LP (or HTE), and the like.

In the case of a small Rz, the metal foil surface may be used after surface treatment.

For the above-mentioned laminate, the impregnated sheet-like material and the conductive metal layer such as a metal foil may be hot pressed, roll laminated or double belt pressed using a continuous laminating apparatus.

The laminate obtained by bonding the conductive metal layer to the heat-resistant resin-impregnated sheet-like material has satisfactory heat resistance and electrical properties, and may therefore be suitably used as a circuit board.

The abbreviations used in the description which follows stand for the following compounds.
a-BPDA: 2,3,3',4'-biphenyltetracarboxylic dianhydride
s-BPDA: 3,3',4,4'-biphenyltetracarboxylic dianhydride
ODPA: 3,3',4,4'-biphenylethertetracarboxylic dianhydride
TPE-R: 1,3-bis(4-aminophenoxy)benzene
APB: 1,3-bis(3-aminophenoxy)benzene
DMZ: 1,2-dimethylimidazole
1M2EZ: 1-methyl-2-ethylimidazole
2MZ: 2-methylimidazole
4E2MZ: 4-ethyl-2-methylimidazole
NMP: N-methyl-2-pyrrolidone
DMAc: N,N-dimethylacetamide In each of the examples below, the physical properties of the polyimides and polyimide-containing glass nonwoven fabrics were determined by the following methods.

(1) Polyimide Thermal Decomposition Temperature

The temperature of the polyimide film was increased, at 10° C./min in nitrogen in an SSC5200 TGA320 apparatus by Seiko Instruments, and the weight reduction was measured. The thermal decomposition temperature was recorded as the temperature when the weight reduction reached 3%.

(2) Polyimide Glass Transition Temperature

The temperature of the polyimide film was increased, at 20° C./min in nitrogen in an SSC5200 DSC320C apparatus by Seiko Instruments, and the differential heat was measured.

(3) Polyimide Film Breaking Elongation

This was measured according to ASTM D882.

(4) Tensile Test in Heated Atmosphere

A Model LTB IRK-style low temperature brine/high temperature tank by Itabashi Rika Kogyo was set in a tensile tester, and a tensile test was conducted after full heating to the prescribed temperature.

EXAMPLE 1

After adding 29.23 g (0.1 mol) of TPE-R and 234.60 g of DMAc into a 1000 ml 4-necked separable flask equipped with a stirrer, a reflux condenser (with moisture separator), a thermometer and a nitrogen inlet tube at room temperature, 29.42 g (0.1 mol) of a-BPDA was added to the mixed solution, while stirring under a nitrogen gas stream, and reaction was carried out for 2 hours to obtain a polyimide precursor solution.

The solution was then diluted with 293.25 g of DMAc to a viscosity of 1.5 poise at 30° C. After next adding 5.87 g (0.06 mol) of DMZ to the solution, it was slowly added to acetone (6.5 L) in a homogenizer (OMNIMIXER LT by Yamato Chemical Co., Ltd.) for precipitation of the polyimide precursor powder. The suspension was filtered and subjected to acetone washing and vacuum dried at 40° C. for 10 hours to obtain 63.42 g of polyimide precursor powder.

After adding 26.10 g of water and 0.9 g (0.0094 mol) of DMZ to 3 g of the polyimide precursor powder (total DMZ/COOH=1.3 mol. eq.), a uniform solution was obtained by dissolving for 2 hours while stirring at 60° C., after which the solution was filtered with a 7 μm filter, under pressure, to obtain a polyimide precursor aqueous solution.

The aqueous solution was then coated onto a glass substrate and subjected to heat treatment in air at 60° C. for 10 minutes, at 100° C. for 10 minutes, at 150° C. for 10 minutes, at 180° C. for 10 minutes, at 210° C. for 10 minutes and at 300° C. for 10 minutes, to obtain a polyimide film.

The polyimide film was peeled from the glass substrate and its thermal and mechanical properties were measured. Satisfactory thermal and mechanical properties were exhibited. The results are summarized in Table 1.

EXAMPLE 2

After adding 29.42 g (0.1 mol) of a-BPDA and 637.86 g of acetone into a 2000 ml 4-necked separable flask equipped with a stirrer, a reflux condenser (with moisture separator), a thermometer and a nitrogen inlet tube and dissolving at room temperature, a solution of 29.23 g (0.1 mol) of TPE-R dissolved in 200 g of acetone was added over a period of one minute, and a reaction was carried out for 2 hours to complete precipitation of the polyimide precursor. Next, 5.87 g (0.06 mol) of DMZ was added to this suspension, and stirring was continued for one hour. The suspension was then filtered, washed with acetone and vacuum dried at 40° C. for 10 hours to obtain 63.16 g of polyimide precursor powder.

After adding 18.1 g of water and 0.6 g (0.0062 mol) of DMZ to 3 g of this polyimide precursor powder (total DMZ/COOH=1.0 mol. eq.), a polyimide precursor aqueous solution and polyimide film were obtained in the same manner as Example 1.

The polyimide film exhibited satisfactory thermal and mechanical properties. The results are summarized in Table 1.

EXAMPLE 3

After adding 15.8 g of water and 1.2 g (0.012 mol) of DMZ to 3 g of polyimide precursor powder (total DMZ/COOH=1.6 mol. eq.) separated from the acetone solution of Example 2, a polyimide precursor aqueous solution and polyimide film were obtained in the same manner as Example 2.

The polyimide film exhibited satisfactory thermal and mechanical properties. The results are summarized in Table 1.

EXAMPLE 4

The same reaction was carried out as in Example 1 except for using 1M2EZ instead of DMZ, to obtain 63.62 g of polyimide precursor powder.

After adding 16.8 g of water and 1.03 g (0.0094 mol) of 1M2EZ to 3 g of this polyimide precursor powder (total 1M2EZ/COOH=1.3 mol. eq.), a polyimide precursor aqueous solution and polyimide film were obtained in the same manner as Example 1.

The polyimide film exhibited satisfactory thermal and mechanical properties. The results are summarized in Table 1.

EXAMPLE 5

Reaction was carried out in the same manner as in Example 2 except that ODPA was used as the tetracarboxylic dianhydride and a reaction between ODPA and TPE-R in acetone was carried out in a suspension state, to obtain 60.00 g of polyimide precursor powder.

After adding 19.6 g of water and 0.64 g (0.0067 mol) of DMZ to 2 g of this polyimide precursor powder (total DMZ/COOH=1.4 mol. eq.), a polyimide precursor aqueous solution and polyimide film were obtained in the same manner as Example 1.

The polyimide film exhibited satisfactory thermal and mechanical properties. The results are summarized in Table 1.

EXAMPLE 6

Reaction was carried out in the same manner as in Example 1 except that s-BPDA was used as the tetracarboxylic dianhydride and APB was used as the aromatic diamine, to obtain 52.26 g of polyimide precursor powder.

After adding 19.2 g of water and 0.90 g (0.0094 mol) of DMZ to 3 g of this polyimide precursor powder (total DMZ/COOH=1.3 mol. eq.), a polyimide precursor aqueous solution and polyimide film were obtained in the same manner as Example 1.

The polyimide film exhibited satisfactory thermal and mechanical properties. The results are summarized in Table 1.

The polyimides obtained in Examples 1-6 were confirmed to be amorphous by X-ray analysis.

Comparative Example 1

To 3 g of the polyimide precursor powder synthesized in Example 2 there were added 16.2 g of water and 0.77 g (0.0094 mol) of 2MZ, but the polyimide precursor powder did not dissolve.

Comparative Example 2

To 3 g of the polyimide precursor powder synthesized in Example 2 there were added 16.2 g of water and 1.04 g (0.0094 mol) of 4E2MZ, but the polyimide precursor powder did not dissolve.

Comparative Example 3

Reaction was carried out in the same manner as in Example 1 except that diethanolamine was used instead of DMZ, to obtain 56.32 g of polyimide precursor powder.

After adding 16.0 g of water and 0.99 g (0.0094 mol) of diethanolamine to 3 g of this polyimide precursor powder, a polyimide precursor aqueous solution and polyimide film were obtained in the same manner as Example 1.

The polyimide film exhibited unsatisfactory thermal and mechanical properties. The results are summarized in Table 1.

Comparative Example 4

Reaction was carried out in the same manner as in Example 1 except that triethanolamine was used instead of DMZ, to obtain 60.65 g of polyimide precursor powder.

After adding 15.6 g of water and 1.40 g (0.0094 mol) of triethanolamine to 3 g of this polyimide precursor powder, a polyimide precursor aqueous solution and polyimide film were obtained in the same manner as Example 1.

The polyimide film exhibited unsatisfactory thermal and mechanical properties. The results are summarized in Table 1.

Comparative Example 5

Reaction was carried out in the same manner as in Example 2 except that N-methyldiethanolamine was used instead of DMZ, to obtain 59.30 g of polyimide precursor powder.

After adding 15.9 g of water and 1.12 g (0.0094 mol) of N-methyldiethanolamine to 3 g of this polyimide precursor powder, a polyimide precursor aqueous solution and polyimide film were obtained in the same manner as Example 1.

The polyimide film exhibited unsatisfactory thermal and mechanical properties. The results are summarized in Table 1.

Comparative Example 6

Reaction was carried out in the same manner as in Example 2 except that 3-diethylamino-1-propanol was used instead of DMZ, to obtain 59.81 g of polyimide precursor powder.

After adding 15.8 g of water and 1.23 g (0.0094 mol) of 3-diethylamino-1-propanol to 3 g of this polyimide precursor powder, a polyimide precursor aqueous solution and polyimide film were obtained in the same manner as Example 1.

The polyimide film exhibited unsatisfactory thermal and mechanical properties. The results are summarized in Table 1.

s-BPDA/ABP:

Thermal decomposition temperature: 506° C.
Tensile breaking strength: 1390 kg/cm$^2$
Breaking elongation: 91%

EXAMPLE 7

The same procedure was followed as in Example 2 except that the amounts of each of the components, a-BPDA, acetone and TPE-R were halved, and the amount of DMZ (0.2 mol) added to the polyimide precursor solution after the reaction was set to 4 molar equivalents with respect to the carboxyl groups of the polyimide precursor, to obtain 39.48 g of polyimide precursor powder.

After adding 17 g of water to 3 g of the water-soluble polyimide precursor powder and stirring at room temperature for one hour, a uniform polyimide precursor aqueous solution was obtained.

The polyimide film obtained from the polyimide precursor aqueous solution was equivalent to that of Example 2.

EXAMPLE 8

Fully aromatic polyamide short fibers (6 mm) were dispersed in water to about 0.0025 wt %, and a procedure was repeated in which the dispersion was gradually pushed through a sieve (1.70 mm openings) with an 80 mmφ scoop to obtain a uniform laminate, which was then peeled from the sieve and dried at 130° C. for one hour to obtain a fully aromatic polyamide short fiber laminate.

This laminate was impregnated with an aqueous solution prepared by diluting the polyimide precursor aqueous solution obtained in Example 1 with an additional 61 g of water, and then after squeezing out the aqueous solution, it was subjected to heat treatment in air at 100° C. for 3 minutes, at 150° C. for 3 minutes, at 180° C. for 3 minutes, at 210°

TABLE 1

| | Solution viscosity (poise) | Film thickness (μm) | Thermal decomposition temperature (° C.) | Glass transition temperature (° C.) | Tensile breaking strength (kg/cm$^2$) | Breaking elongation (%) |
|---|---|---|---|---|---|---|
| Example 1 | 94 | 14 | 525 | 257 | 969 | 70 |
| Example 2 | 500 | 14 | 532 | 258 | 971 | 61 |
| Example 3 | 92 | 14 | 525 | 259 | 1004 | 86 |
| Example 4 | 0.7 | 14 | 526 | 256 | 1012 | 35 |
| Example 5 | 5.7 | 10 | 524 | 216 | 1250 | 83 |
| Example 6 | 56 | 10 | 524 | 208 | 1361 | 89 |
| Comp. Ex. 3 | 0.1 | 16 | 492 | 234 | 1005 | 9 |
| Comp. Ex. 4 | 0.1 | 16 | 484 | 245 | 1020 | 12 |
| Comp. Ex. 5 | — | 10 | 475 | 251 | 970 | 12 |
| Comp. Ex. 6 | — | 15 | 495 | 236 | 923 | 5 |

For comparison, the following are the properties of polyimides obtained in the same manner as Examples 1, 5 and 6, except that heating, drying and imidation were carried out from a polyimide precursor solution obtained by polymerization in DMAc.

a-BPDA/TPE-R:

Thermal decomposition temperature: 520° C.
Tensile breaking strength: 1000 kg/cm$^2$
Breaking elongation: 64%

ODPA/TPE-R:

Thermal decomposition temperature: 517° C.
Tensile breaking strength: 1450 kg/cm$^2$
Breaking elongation: 85%

C. for 3 minutes and at 285° C. for 3 minutes, and finally subjected to thermocompression bonding for one minute using a compression molding machine (YSR-10 by Shinto Metal Industries, Ltd.) at a press temperature of 320° C. and a pressing pressure of 5 MPa.

The obtained laminate contained 3 wt % of the polyimide, and had a weight of 33 g/m$^2$ and a tensile strength of 280 g/mm$^2$. The laminate without the polyimide had a weight of 40 g/m$^2$ and a tensile strength below detection sensitivity.

EXAMPLE 9

A laminate was obtained in the same manner as Example 8, except that fully aromatic polyamide fibrillated short fibers (2 mm) were used instead of fully aromatic polyamide short fibers (6 mm).

The obtained laminate contained 4 wt % of the polyimide, and had a weight of 50 g/m² and a tensile strength of 1600 g/mm². The laminate without the polyimide had a weight of 43 g/m² and a tensile strength of 320 g/mm².

EXAMPLE 10

Preparation of Polyimide Precursor Powder and Aqueous Solution After adding 29.42 g (0.1 mol) of a-BPDA and 637.86 g of acetone into a 500 ml 4-necked separable flask equipped with a stirrer, a thermometer and a nitrogen inlet tube and dissolving at room temperature, a solution of 29.23 g (0.1 mol) of TPE-R dissolved in 200 g of acetone was added over a period of one minute, and a reaction was carried out for 2 hours to complete precipitation of the polyimide precursor powder. Next, 5.87 g (0.06 mol) of DMZ was added to this suspension, and stirring was continued for one hour. The suspension was then filtered, washed with acetone and vacuum dried at 40° C. for 10 hours to obtain 63.16 g of polyimide precursor compound powder.

To 3 g of this polyimide precursor compound powder there were added 4.1 g of water and 0.9 g (0.0094 mol) of DMZ, and dissolving was accomplished for 2 hours while stirring at 60° C. to obtain a polyimide precursor aqueous solution.

Polyimide Physical Properties

The aqueous solution was then coated onto a glass substrate and subjected to heat treatment in air at 60° C. for 10 minutes, at 100° C. for 10 minutes, at 150° C. for 10 minutes, at 180° C. for 10 minutes, at 210° C. for 10 minutes and at 300° C. for 10 minutes, to obtain a heat-treated polyimide film.

The polyimide film had a thermal decomposition temperature of 525° C., a glass transition temperature of 257° C., a tensile breaking strength of 969 Kgf/cm² and a tensile breaking elongation of 70%, while it was confirmed to be amorphous by X-ray analysis.

EXAMPLE 11

Synthesis of Polyimide Powder and Preparation of DMAc Solution

After adding 29.23 g (0.1 mol) of TPE-R and 234.60 g of NMP into a 1000 ml 4-necked separable flask equipped with a stirrer, a reflux condenser (with moisture separator), a thermometer and a nitrogen inlet tube at room temperature, 29.42 g (0.1 mol) of a-BPDA was added to the mixed solution while stirring under a nitrogen gas stream, and reaction was carried out for 2 hours to obtain a polyimide precursor. The solution was then heated to 180° C. and reaction was conducted for 7 hours while distilling off the water to obtain a polyimide.

The solution was then diluted with 293.25 g of NMP, and after adding 5.87 g (0.06 mol) of DMZ to the solution, it was slowly added to 6500 ml of acetone in a bath equipped with a homogenizer (OMNIMIXER LT by Yamato Science Co., Ltd.) for precipitation of the polyimide powder. The suspension was filtered and subjected to acetone washing and vacuum dried at 40° C. for 10 hours to obtain 54.06 g of polyimide powder.

A polyimide solution was obtained by adding 170 g of NMP to 30 g of this polyimide powder and dissolving it while stirring at room temperature.

The polyimide had a glass transition temperature of 256° C.

EXAMPLE 12

A 50×55 mm glass nonwoven fabric with a weight of 11.63 g/m² was impregnated with the polyimide precursor aqueous solution of Example 10, and then sandwiched between filter paper before wiping off the excess precursor solution. The temperature was raised from 60° C. to 300° C. over a period of 12 minutes and heat treatment was carried out at 300° C. for 3 minutes, after which a hot press (miniTESTPRESS-10, MP-SCH by Toyo Seiki Co.) set to 320° C. was used for thermocompression bonding at a pressing pressure of 2.5 MPa for one minute to obtain a glass nonwoven fabric containing the polyimide at 0.65 g/m².

Measurement of the tensile strength of the polyimide-containing glass nonwoven fabric according to JIS-P8113 gave a value of 2.1 kg/15 mm width.

Measurement of the tensile strength of the polyimide-containing glass nonwoven fabric after standing at 300° C. for one hour gave a value of 1.9 kg/15 mm width.

EXAMPLE 13

A glass nonwoven fabric containing a polyimide at 0.94 g/m² was obtained, in the same manner as Example 12, except that the pressure applied to the filter paper and the precursor impregnation amount were changed.

The tensile strength of the polyimide-containing glass nonwoven fabric was 2.1 kg/15 mm width.

The tensile strength of the polyimide-containing glass nonwoven fabric after standing at 300° C. for one hour gave a value of 1.9 kg/15 mm width.

EXAMPLE 14

A 100×100 mm sample of the polyimide-containing glass nonwoven fabric obtained in Example 12 was impregnated with the polyimide solution of Example 11. The temperature was raised from 100° C. to 300° C. over a period of 40 minutes and heat treatment was carried out at 300° C. for 5 minutes, to obtain a prepreg containing the polyimide at 60 g/m².

The obtained prepreg was laminated with a copper foil (3EC electrolytic copper foil by Mitsui Metal & Mining Co., Ltd., 35 µm thickness) on one side and subjected to thermocompression bonding for one minute at 5 MPa with a hot press set to 320° C.

The 90° peel strength of the laminated sheet was 1.0 kg/cm.

Measurement of the 90° peel strength of the laminated sheet at room temperature after standing at 200° C. for 24 hours gave a value of 0.8 kg/cm.

The laminated sheet produced no swelling even when allowed to stand at 250° C. for 2 hours.

EXAMPLE 15

A glass woven fabric containing a polyimide at 3.4 g/m² was obtained by the same procedure as Example 12, except that a 100×100 mm sample of a 48 g/m² glass woven fabric was used.

A prepreg containing the polyimide at 64 g/m² was obtained by the same procedure as in Example 14, except that the polyimide-containing glass woven fabric was used.

A copper foil was also laminated thereon by the same procedure as in Example 14 except that the above-mentioned prepreg was used.

The 90° peel strength of the laminated sheet was 0.9 kg/cm.

The present invention having the constitution described in detail above exhibits the following effects.

According to the invention it is possible to obtain a water-soluble powdered polyimide precursor with virtually no reduction in heat resistance or mechanical properties of polyimide molded articles.

The aqueous polyimide precursor solution obtained according to the invention also exhibits satisfactory workability for production of polyimide molded articles exhibiting satisfactory properties.

The process of the invention can also easily yield a aqueous polyimide precursor solution giving polyimide molded articles exhibiting satisfactory properties.

The polyimide molded articles obtained according to the invention also exhibit satisfactory heat resistance, tensile strength and elongation.

The invention also allows production of nonwoven fabrics as heat-resistant fiber impregnated materials while requiring substantially no use of organic solvents in the heating step.

The invention can also give heat-resistant impregnated materials and laminates that maintain their heat resistance and strength.

We claim:

1. A water-soluble polyimide precursor comprising the reaction product of
    a tetracarboxylic acid component,
    an aromatic diamine component, and
    at least about 0.7 molar equivalents, with respect to the carboxyl groups of the polyimide precursor, of 1,2-dimethylimidazole and/or 1-methyl-2-ethylimidazole.

2. The water-soluble polyimide precursor according to claim 1, wherein the tetracarboxylic acid component comprises at least 50% of a 2,3,3',4'-biphenyltetracarboxylic acid, dianhydride or half-ester thereof.

3. The water-soluble polyimide precursor according to claim 2, wherein the tetracarboxylic acid component that is not a 2,3,3',4'-biphenyltetracarboxylic acid, dianhydride or half-ester thereof, if any, is selected from the group consisting of 3,3',4,4'-biphenyltetracarboxylic dianhydride, pyrometallitic dianhydride, 3,3'4,4'-benzophenonetetracarboxylic dianhydride, dianhydride of 2,2'-bis(3,4-dicarboxyphenyl)propane, dianhydride of bis(3,4-dicarboxyphenyl)methane, dianhydride of bis(3,4-dicarboxyphenyl)ether, and tetracarboxylic acids and half esters thereof.

4. The water-soluble polyimide precursor according to claim 1, wherein the aromatic diamine component is selected from the group consisting of paraphenylenediamine (p-phenylenediamine), 4,4'-diaminodiphenylether, 1,3-bis(4-aminophenoxy)benzene, 1,3-bis(3-aminophenoxy)benzene, 4,4'-diaminodiphenylpropane, 4,4'-diaminodiphenylethane, 4,4'-diaminodiphenylmethane, 2,2'-bis[4-(4-aminophenoxy)phenyl]propane, 2,2'-bis[4-(4-aminophenoxy)phenyl]1,1,1,3,3,3-hexafluoropropane, bis[4-(4-aminophenoxy)phenyl]ether and bis[4-(3-aminophenoxy)phenyl]sulfone.

5. The water-soluble polyimide precursor according to claim 4, wherein the aromatic diamine component is selected from the group consisting of 1,3-bis(4-aminophenoxy)benzene and 1,3-bis(3-aminophenoxy)benzene.

6. A polyimide precursor solution prepared by dissolving the water-soluble polyimide precursor according to claim 1 in water.

7. A polyimide prepared by imidation of the water-soluble polyimide precursor according to claim 1, wherein the polyimide has a thermal decomposition temperature of at least 500° C.

8. The polyimide according to claim 7, wherein the polyimide is amorphous based on X-ray analysis and has a glass transition temperature of 190° C. to 350° C.

9. The polyimide according to claim 7 or claim 8, wherein the polyimide has a breaking elongation of at least 15% when shaped into a film.

10. The polyimide according to claim 7, wherein the polyimide exhibits a heat-bonding property between about 210° C. and about 400° C.

11. The polyimide according to claim 10, wherein the polyimide exhibits a heat-bonding property between about 250° C. and about 275° C.

12. A powdered water-soluble polyimide precursor prepared by separation from the mixture resulting from reaction of a polyimide precursor comprising a tetracarboxylic acid component and an aromatic diamine component with at least about 0.7 molar equivalents, with respect to the carboxylic groups of said polyimide precursor, of 1,2-dimethylimidazole and/or 1-methyl-2-ethylimidazole.

* * * * *